United States Patent
Maffini Alvaro et al.

(10) Patent No.: US 12,217,964 B2
(45) Date of Patent: Feb. 4, 2025

(54) DOPED SEMICONDUCTOR LAYER FORMING METHOD

(71) Applicant: Commissariat à lÉnergie Atomique et aux Énergies Alternatives, Paris (FR)

(72) Inventors: Virginie Maffini Alvaro, Grenoble (FR); Hubert Bono, Grenoble (FR); Julia Simon, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 755 days.

(21) Appl. No.: 17/105,182

(22) Filed: Nov. 25, 2020

(65) Prior Publication Data
US 2021/0184073 A1   Jun. 17, 2021

(30) Foreign Application Priority Data
Dec. 12, 2019   (FR) ...................................... 1914289

(51) Int. Cl.
*H01L 21/265*   (2006.01)
*H01L 21/04*   (2006.01)

(52) U.S. Cl.
CPC ........ *H01L 21/2656* (2013.01); *H01L 21/046* (2013.01); *H01L 21/26553* (2013.01)

(58) Field of Classification Search
CPC ................ H01L 21/046; H01L 21/2654–2656
See application file for complete search history.

(56) References Cited

U.S. PATENT DOCUMENTS

| | | | | |
|---|---|---|---|---|
| 4,391,651 A * | 7/1983 | Yoder | ................. | H01L 21/2654 257/617 |
| 4,717,685 A * | 1/1988 | Nakajima | ......... | H01L 29/66924 438/945 |
| 5,318,915 A | 6/1994 | Baliga et al. | | |
| 6,221,700 B1 | 4/2001 | Okuno et al. | | |
| 2016/0093495 A1 * | 3/2016 | Agraffeil | ............. | H01L 29/2003 438/521 |

FOREIGN PATENT DOCUMENTS

| JP | S60-47428 A | 3/1985 |
|---|---|---|
| JP | 2004-356257 A | 12/2004 |

OTHER PUBLICATIONS

Preliminary Search Report for French Application No. 1914289, mailed Aug. 13, 2020.

* cited by examiner

*Primary Examiner* — Zandra V Smith
*Assistant Examiner* — Molly K Reida
(74) *Attorney, Agent, or Firm* — Wolf, Greenfield & Sacks, P.C.

(57) ABSTRACT

A method of obtaining a doped semiconductor layer, including the successive steps of: a) performing, in a first single-crystal layer made of a semiconductor alloy of at least a first element A1 and a second element A2, an ion implantation of a first element B which is a dopant for the alloy and of a second element C which is not a dopant for the alloy, to make an upper portion of the first layer amorphous and to preserve the crystal structure of a lower portion of the first layer; and b) performing a solid phase recrystallization anneal of the upper portion of the first layer, resulting in transforming the upper portion of the first layer into a doped single-crystal layer of the alloy.

12 Claims, 2 Drawing Sheets

DOPED SEMICONDUCTOR LAYER FORMING METHOD

CROSS-REFERENCE TO RELATED APPLICATION

This application claims priority to French patent application number 1914289, filed on Dec. 12, 2019, the content of which is incorporated herein by reference in its entirety.

TECHNICAL BACKGROUND

The present disclosure concerns a method of obtaining a doped semiconductor layer, particularly for the forming of light-emitting devices.

PRIOR ART

A light-emitting device conventionally comprises one or a plurality of light-emitting cells capable of converting an electric signal into a light radiation. Each light-emitting cell may comprise a stack of a P-type semiconductor layer, called anode layer, of an active layer, and of an N-type doped semiconductor layer, called cathode layer. The anode semiconductor layer is electrically connected to an anode electrode of the cell, and the cathode semiconductor layer is electrically connected to a cathode electrode of the cell. In operation, an electric current is applied between the semiconductor anode and cathode layers of the cell, via the anode and cathode layers. Under the effect of this current, the active layer emits a light ray in a wavelength range which essentially depends on its composition.

To limit the contact resistance between the anode electrode and the anode semiconductor layer, on the one hand, and/or between the cathode electrode and the cathode semiconductor layer, on the other hand, it is desirable to dope the anode and/or cathode semiconductor layers to a relatively high level. However, according to the type of semiconductor material used to form the anode and cathode layers, the doping may be difficult to perform. In particular, it is difficult to dope to high levels the semiconductor materials having a large bandgap, and particularly III-V type semiconductor materials, which are, besides, well adapted to the forming of light-emitting cells.

It would be desirable to have a method of obtaining a doped semiconductor layer, this method overcoming all or part of the disadvantages of known doping methods.

SUMMARY

For this purpose, an embodiment provides a method of obtaining a doped semiconductor layer, comprising the successive steps of:
a) performing, in a first single-crystal layer made of a semiconductor alloy of at least a first element $A_1$ and a second element $A_2$, an ion implantation of a first element B which is a dopant for said alloy and of a second element C which is not a dopant for said alloy, to make an upper portion of the first layer amorphous and to preserve the crystal structure of a lower portion of the first layer; and
b) performing a solid-phase recrystallization anneal of the upper portion of the first layer, resulting in transforming the upper portion of the first layer into a doped single-crystal layer of said alloy,
wherein the dopant and non-dopant elements B and C substitute to atoms of element $A_1$.

According to an embodiment, during step a), a protection layer covers the upper surface of the first layer.

According to an embodiment, during step a), the implantation conditions are selected so that the lower portion of the first layer has a thickness smaller than one fifth of the thickness of the first layer.

According to an embodiment, during step a), the implantation conditions are selected so that the lower portion of the first layer has a thickness in the range from 2 to 10 nm.

According to an embodiment, during step a), a complementary implantation of element $A_2$ is performed to compensate for the addition of elements B and C.

According to an embodiment, non-dopant element C is selected while taking into account the ratio of the covalent radius of element $A_1$ to the covalent radius of dopant element B, to obtain, at the end of step b), a generally non-stressed cell.

According to an embodiment, when the covalent radius of dopant element B is greater than the covalent radius of element $A_1$, non-dopant element C is selected to have a covalent radius smaller than or equal to that of element $A_1$ and, when the covalent radius of dopant element B is smaller than the covalent radius of element $A_1$, non-dopant element C is selected to have a covalent radius greater than or equal to that of element $A_1$.

According to an embodiment, elements $A_1$ and $A_2$ respectively are a group-III element and a group-V element, and element B is a group-II element or a group-IV element, and element C is a group-III element.

According to an embodiment, elements $A_1$ and $A_2$ respectively are gallium and nitrogen.

According to an embodiment, elements B and C respectively are magnesium and aluminum.

According to an embodiment, elements B and C respectively are silicon and indium.

According to an embodiment, elements $A_1$ and $A_2$ respectively are silicon and carbon, and elements B and C respectively are boron or germanium, or elements B and C respectively are arsenic and carbon.

According to an embodiment, at step b), the solid-phase recrystallization anneal is carried out at a temperature in the range from 300 to 1,200° C.

According to an embodiment, the solid-phase recrystallization anneal is carried out at approximately 400° C.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the following description mainly concerns the obtaining of a doped semiconductor layer. The different structures where such a layer may be used have not been detailed. Further, the steps that may be implemented, before or after the forming of the doped layer, to obtain such structures, have not been detailed.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1A:
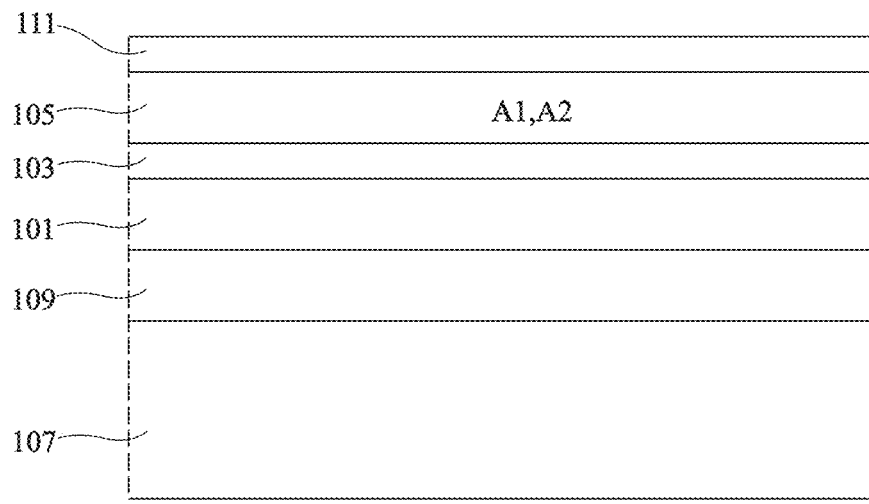
FIG. 1A schematically shows a step of a method of obtaining a doped semiconductor layer according to an embodiment.
Figure 1B:
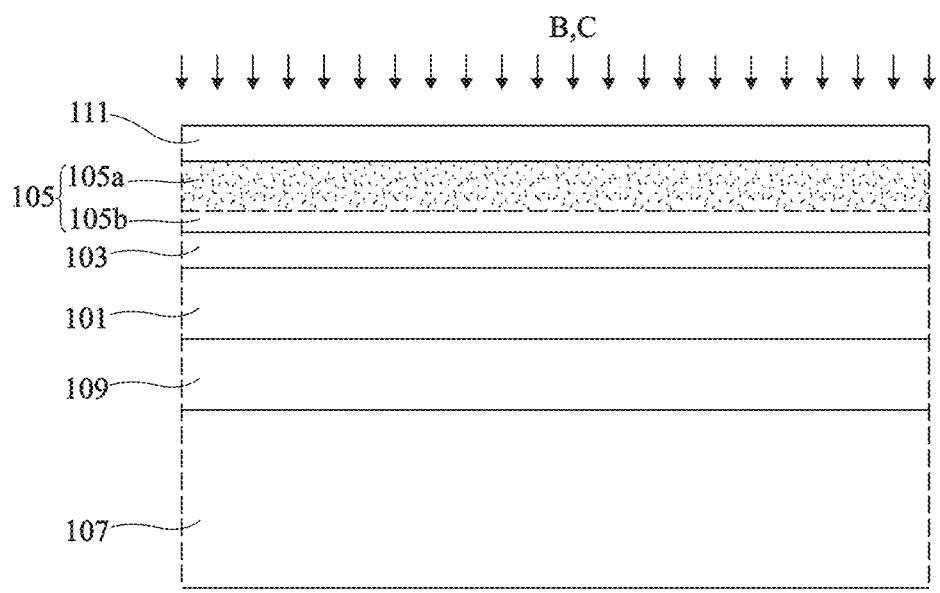
FIG. 1B schematically shows another step of a method of obtaining a doped semiconductor layer according to an embodiment.
Figure 1C:
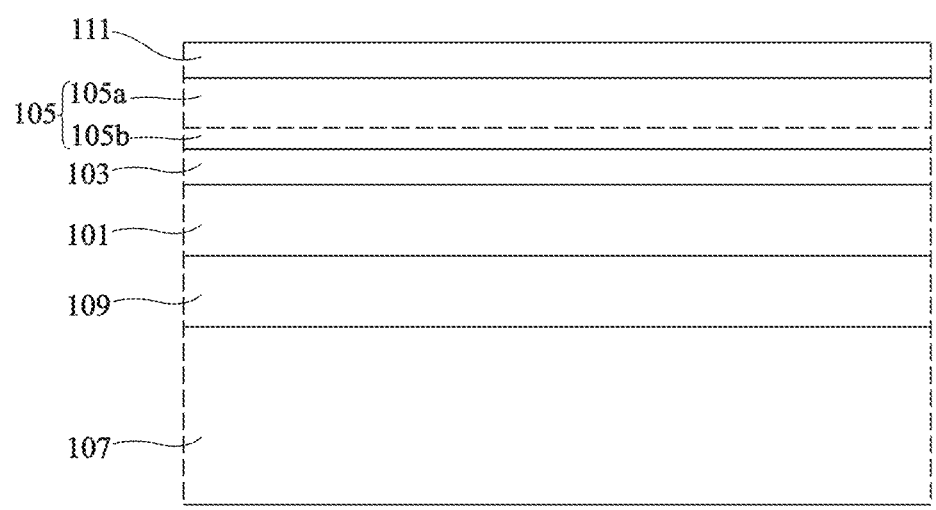
FIG. 1C schematically shows a method of obtaining a doped semiconductor layer according to an embodiment.

FIGS. 1A to 1C are cross-section views illustrating successive steps of an example of a method of obtaining a doped semiconductor layer according to an embodiment.

The forming of a light-emitting cell stack comprising a first semiconductor layer 101 of a first conductivity type forming an anode or cathode layer of the cell, of an active layer 103, and of a second doped semiconductor layer 105 of the second conductivity type forming a cathode or anode layer of the cell is considered in the present example. Layers 101 and 105 are for example layers of a semiconductor material III-V, for example, gallium nitride layers. Active layer 103 for example comprises confinement means corresponding to multiple quantum wells. As an example, active layer 103 is formed of an alternation of semiconductor layers of a first material and of semiconductor layers of a second material, each layer of the first material being sandwiched between two layers of the second material, the first material having a narrower bandgap than that of the second material, to define multiple quantum wells. Layers 101, 103, and 105 are for example formed by epitaxy. The stack of layers 101, 103, and 105 is arranged on a support substrate 107, for example, made of sapphire or of silicon. A stack 109 of one or a plurality of buffer layers may form an interface between substrate 107 and the stack of layers 101, 103, and 105. In the shown example, stack 109 is arranged on top of and in contact with the upper surface of substrate 107, layer 101 is arranged on top of and in contact with the upper surface of stack 109, layer 103 is arranged on top of and in contact with the upper surface of layer 101, and layer 105 is arranged on top of and in contact with the upper surface of layer 103.

The doping of the upper semiconductor layer 105 of the stack is here more particularly considered.

FIG. 1A illustrates the structure obtained at the end of a step of deposition of an insulating protection layer 111, for example, made of silicon nitride ($Si_3N_4$), on the upper surface side of layer 105, for example, in contact with the upper surface of layer 105. Layer 111 for example extends over the entire surface of layer 105. The thickness of layer 111 is for example in the range from 5 to 500 nm, and preferably from 10 to 50 nm, for example, in the order of 20 nm. At this stage, layer 105 may be a non-doped layer. As a variant, layer 105 may have been already previously doped in situ during its epitaxial growth. It is desired in this case to increase the doping level of layer 105.

FIG. 1B illustrates a step of ion implantation, in semiconductor layer 105, through protection layer 111, of an element which is a dopant for the material of layer 105. During this step, as will be explained in further detail hereafter, an element which is not a dopant for the material of layer 105 is further implanted, preferably with no intermediate anneal step to limit, at the cell scale, the stress introduced by the dopant element.

The energies and doses of implantation of the dopant element and of the non-dopant element are selected according to the desired doping profile. The implantations energies and doses are further selected to obtain a full amorphization of an upper portion 105a of layer 105, and to keep the original crystal reference in a lower portion 105b of layer 105. Preferably, the thickness of the lower reference single-crystal layer 105b is relatively small to enable to carry off possible dislocations or other crystal defects during a subsequent step of recrystallization anneal of layer 105a. As an example, the thickness of the lower reference single-crystal layer 105b is smaller than half the thickness of original layer 105, for example smaller than one fifth of the thickness of original layer 105. As an example, the thickness of lower reference single-crystal layer 105b is in the range from 2 to 100 nm, preferably from 2 to 10 nm. Layer 105 for example has a thickness in the range from 10 to 500 nm, for example from 100 to 400 nm.

Protection layer 111 particularly enables to protect layer 105 against the sputtering during the step of ion implantation of the dopant element and of the non-dopant element.

FIG. 1C illustrates a step of anneal of the structure obtained at the end of the steps of FIGS. 1A and 1B, to obtain a solid phase recrystallization of the upper portion 105a of layer 105. The anneal is for example performed at a temperature in the range from 300 to 1200° C. The duration of the recrystallization anneal is for example in the range from 1 minute to 10 hours. Preferably, the anneal is performed at low temperature, for example, at approximately 400° C., for example for approximately 1 hour. During this step, a recrystallization of layer 105a is obtained. The crystal reference is provided by the underlying single-crystal layer 105b. At the end of this step, a doped crystal semiconductor layer 105a is obtained. The doping level of layer 105a depends on the dose of the dopant implanted at the step of FIG. 1B.

Protection layer 111 may be removed after the anneal. As a variant, layer 111 may be removed before the anneal. Subsequent steps, not detailed, may then be implemented to form one or a plurality of light-emitting cells from the obtained structure. In particular, a step of deposition of an electrode on top of and in contact with layer 105a may be provided.

The doping method described in relation with FIGS. 1A to 1C is particularly advantageous for the doping of a layer of a III-V-type semiconductor material. The method may however be adapted to the doping of other semiconductor alloys, and in particular semiconductor alloys having a large bandgap, for example, greater than 1.5 eV and preferably greater than 3 eV.

Generally, layer 105 may be a single-crystal layer of an alloy of at least one first element which will be called element A1 hereafter, for example, a group-III element, and one second element, which will be called element A2 hereafter, for example, a group-V element. The dopant element implanted at the step of FIG. 1B, which will be called element B hereafter, may be a P-type or N-type dopant element. As an example, dopant element B is intended to substitute to atoms of element A1 of the initial alloy to obtain a P-type or N-type doping. In the case where element A1 of the alloy is a group-III element, dopant element B may be a group-II element to obtain a P-type doping, or a group-IV element to obtain an N-type doping. The covalent radius of dopant element B may be different from that of substituted element A1. The non-dopant element implanted at the step of FIG. 1B, which will be called element C hereafter, is selected to compensate for the stress introduced, at the cell level, by dopant level B. As an example, if dopant element B has a covalent radius smaller than that of substituted element A1, an element of the same group as element A1 having a covalent radius greater than or equal to and preferably greater than that of element A1 may be selected as non-dopant element C. Conversely, if dopant element B has a covalent radius greater than that of substituted element A1, an element of the same group as element A1 having a covalent radius smaller than or equal to and preferably smaller than that of element A1 may be selected as non-dopant element C.

During the implantation step of FIG. 1B, in addition to elements B and C, atoms of element A2 of the initial alloy may be implanted, preferably with no intermediate anneal step, to compensate for the addition of elements B and C and to keep the general stoichiometry of the material.

The implantation dose of dopant element B during the step of FIG. 1B is preferably relatively high, for example, greater than $10^{20}$ atoms/cm$^3$, to favor the amorphization of the upper portion 105a of layer 105.

Examples of application of the method of FIGS. 1A to 1C to the doping of a gallium nitride layer (GaN) will now be described. In this case, initial semiconductor layer 105 is a single-crystal GaN layer. Elements A1 and A2 of the semiconductor alloy forming initial layer 105 respectively are gallium (Ga) and nitrogen (N). The layer 105a which is desired to be obtained at the end of the process is a $C_yB_xGa_{1-x-y}N$ layer, with x and y respectively defining the concentration of dopant element B and the concentration of non-dopant element C in the final layer. Dopant element B must substitute to gallium (Ga). The concentration x of dopant element B is selected to obtain the desired doping level. Non-dopant element C and concentration y of non-dopant C are selected according to the covalent radius of dopant element B and to the concentration x of dopant B to obtain in fine a generally non-stressed layer 105a.

As an example, concentrations x and y are selected to respect the following rule of mixtures:

$$a*x + b*y = 0 \text{ with:} \quad \text{[Math 1]}$$

$$a = \frac{1}{3} * \left(1 - \frac{RB}{Rh}\right)^3 * \frac{1}{S} \text{ and:} \quad \text{[Math 2]}$$

$$b = \frac{1}{3} * \left(1 - \frac{RC}{Rh}\right)^3 * \frac{1}{S} \quad \text{[Math 3]}$$

where RB, RC, and Rh respectively designate the covalent radiuses of elements B, C, and A1 (Ga in the present example), and S designates the site concentration in the host matrix, that is, the number of gallium atoms in the initial cell of layer 105.

More generally, to define the concentration y of non-dopant element C, other rule of mixtures may be defined, based on a modelization of the stress in a crystal semiconductor alloy.

During the implantation step of FIG. 1C, in addition to elements B and C, it is provided to implant nitrogen (element A2), preferably with no intermediate anneal step, to compensate for the addition of elements B and C and to keep the general stoichiometry of the material. In the absence of such a co-implantation of nitrogen, the stoichiometry of the final layer 105a would be $C_yB_xGa_{1-x-y}N_{1-x-y}$. To compensate for the implantation of elements B and C, a co-implantation of nitrogen at a concentration z=x+y is here provided.

Case of the P Doping:

To obtain a P-type doped layer 105a, the dopant element B implanted at the step of FIG. 1B may be a group-II element, for example magnesium (Mg), beryllium (Be), zinc (Zn), or calcium (Ca). Non-dopant element C may be an element of the same group as gallium, that is, a group-III element, for example aluminum or indium. Preferably, dopant element B is magnesium. In the case where dopant element B is magnesium, non-dopant element C is preferably aluminum. Indeed, magnesium has a greater covalent radius than that of gallium, while aluminum has a smaller covalent radius than that of gallium, which enables to balance the stress in the cell.

As an example, the implanted magnesium dose is in the order of $3*10^{15}$ atoms/cm$^2$ with an implantation energy in the order of 23 keV, the implanted aluminum dose is in the order of $4.6*10^{15}$ atoms/cm$^2$ with an implantation energy in the order of 120 keV, and the implanted nitrogen dose is in the order of $9.6*10^{15}$ atoms/cm$^2$ with an implantation energy in the order of 15 keV.

Case of the N Doping:

To obtain an N-type doped layer 105a, the dopant element B implanted at the step of FIG. 1B may be a group-IV element, for example, silicon (Si), germanium (Ge), or carbon (C). Non-dopant element C may be an element of the same group as gallium, that is, a group-III element, for example aluminum or indium. Preferably, dopant element B is silicon. In the case where dopant element B is silicon, non-dopant element C preferably is indium. Indeed, silicon has a smaller covalent radius than that of gallium, while indium has a greater covalent radius than that of gallium, which enables to balance the stress in the cell.

It will be within the abilities of those skilled in the art to adapt the above-described method to the doping of other semiconductor alloys. For example, in the case where layer 105 is made of silicon carbide (SiC), elements A1 and A2 are respectively silicon (Si) and carbon (C). To obtain a P-type doping, dopant element B may be a group-II element, for example, boron (B) and non-dopant element C may be a group-III element, for example, germanium. To obtain an N-type doping, dopant element B may be a group-IV element, for example, arsenic, and non-dopant element C may be a group-III element, for example, carbon.

Various embodiments and variants have been described. Those skilled in the art will understand that certain features of these embodiments can be combined and other variants will readily occur to those skilled in the art. In particular, the described embodiments are not limited to the examples of materials or to the examples of numerical values mentioned in the description.

Further, although an example of application of the doping method to the forming of light-emitting cells has been described hereabove, the described embodiments are not limited to this specific application. As a variant, the method of obtaining a doped semiconductor layer described hereabove may be used for other applications, for example, for the forming of semiconductor power components (transistors, diodes, etc.).

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of obtaining a doped semiconductor layer, comprising the successive steps of:
    a) performing, in a first single-crystal layer made of a semiconductor alloy of at least a first element A1 and a second element A2, an ion implantation of a first element B which is a dopant for said alloy and of a second element C which is not a dopant for said alloy, to make an upper portion of the first layer amorphous and to preserve the crystal structure of a lower portion of the first layer; and
    b) performing a solid phase recrystallization anneal of the upper portion of the first layer, resulting in transforming the upper portion of the first layer into a doped single-crystal layer of said alloy,
    wherein the dopant and non-dopant elements B and C substitute to atoms of element A1,
    wherein, during step a), a complementary implantation of element A2 is performed to compensate for the addition of elements B and C.

2. The method according to claim 1, wherein, during step a), a protection layer covers the upper surface of the first layer.

3. The method according to claim 1, wherein, during step a), the implantation conditions are selected so that the lower portion of the first layer has a thickness smaller than one fifth of the thickness of the first layer.

4. The method according to claim 1, wherein, during step a), the implantation conditions are selected so that the lower portion of the first layer has a thickness in the range from 2 to 10 nm.

5. The method according to claim 1, wherein non-dopant element C is selected while taking into account the ratio of the covalent radius of element A1 to the covalent radius of dopant element B, to obtain, at the end of step b), a generally non-stressed cell.

6. The method according to claim 1, wherein, when the covalent radius of dopant element B is greater than the covalent radius of element A1, non-dopant element C is selected to have a covalent radius smaller than or equal to that of element A1, or, when the covalent radius of dopant element B is smaller than the covalent radius of element A1, non-dopant element C is selected to have a covalent radius greater than or equal to that of element A1.

7. The method according to claim 1, wherein elements A1 and A2 are respectively a group-III element and a group-V element, and wherein element B is a group-II element or a group-IV element, and element C is a group-III element.

8. The method according to claim 7, wherein elements A1 and A2 respectively are gallium and nitrogen.

9. The method according to claim 8, wherein elements B and C respectively are magnesium and aluminum.

10. The method according to claim 8, wherein elements B and C respectively are silicon and indium.

11. The method of claim 1, wherein, at step b), the solid phase recrystallization anneal is carried out at a temperature in the range from 300 to 1,200° C.

12. The method according to claim 1, wherein the solid phase crystallization anneal is carried out at approximately 400° C.

* * * * *